United States Patent
Rodi

(10) Patent No.: US 6,667,696 B2
(45) Date of Patent: Dec. 23, 2003

(54) SENSOR SYSTEM FOR MEASURING ANGLES AND POSITIONS

(76) Inventor: Anton Rodi, Paul-Ehrlich-Strasse 1, D-69181 Leimen (DE)

( * ) Notice: Subject to any disclaimer, the term of this patent is extended or adjusted under 35 U.S.C. 154(b) by 0 days.

(21) Appl. No.: 10/116,541

(22) Filed: Apr. 4, 2002

(65) Prior Publication Data

US 2002/0167420 A1 Nov. 14, 2002

(30) Foreign Application Priority Data

May 13, 2001 (DE) ......................................... 101 23 292

(51) Int. Cl.[7] ................................................. H03M 1/22
(52) U.S. Cl. ........................... 341/11; 341/15; 341/17; 701/220; 303/186; 303/187; 33/707
(58) Field of Search .............................. 341/11, 15, 17; 701/220; 375/240.13; 303/186, 187; 180/168; 378/587

(56) References Cited

U.S. PATENT DOCUMENTS

| | | | |
|---|---|---|---|
| 4,710,812 A | * 12/1987 | Murakami et al. | ...... 375/240.13 |
| 5,539,646 A | * 7/1996 | Petersen et al. | ............. 701/220 |
| 5,617,320 A | * 4/1997 | Petersen et al. | ............. 701/220 |
| 6,312,065 B1 | * 11/2001 | Freitag et al. | ............... 303/187 |

FOREIGN PATENT DOCUMENTS

| | | | |
|---|---|---|---|
| DE | 196 13 884 A1 | 10/1997 | |
| DE | 19613884 A1 | * 10/1997 | .................. 341/11 |
| DE | 198 56 708 A1 | 8/1999 | |
| DE | 199 33 491 A1 | 2/2001 | |
| EP | 0 635 700 A1 | 1/1995 | |
| EP | 0 660 209 A1 | 6/1995 | |
| EP | 1 102 039 A1 | 5/2001 | |
| EP | 1 102 040 A1 | 5/2001 | |

* cited by examiner

*Primary Examiner*—Michael Tokar
*Assistant Examiner*—Lam T. Mai
(74) *Attorney, Agent, or Firm*—Laurence A. Greenberg; Werner H. Stemer; Ralph E. Locher

(57) ABSTRACT

A sensor system is provided in which a digital absolute value of the particular position of a stationary part (stator) with respect to a part moving relative to it (rotor) is created, which is transferred in serial transmission to an evaluation circuitry, whereby transfer of the serial absolute value is induced each time by an external signal. In order to increase the resolution of the encoder, the change in absolute value is recorded each time in the sensor and finest interpolation is undertaken beginning each time from the time of the change. Finally, the absolute value is amended by the accumulated result of finest interpolation when interrogated by the external signal.

14 Claims, 1 Drawing Sheet

SENSOR SYSTEM FOR MEASURING ANGLES AND POSITIONS

BACKGROUND OF THE INVENTION

Field of the Invention

The present invention relates to a sensor system which is to be used for angular and position measurements.

How the digital absolute value is determined in the encoder is to be left open here. For example, it may be determined using the method described in the Swiss Patent Application No. 02105/99. In that example the angular and/or position measuring device contains a scanning head with at least one sensor for determining absolute angular and/or position values and at least one sensor for determining angular and/or position incremental values lying between two consecutive absolute values. The scanning head contains the means of creating a total absolute value from an absolute value determined by at least one sensor and an incremental value determined by at least one sensor and of making this total absolute value available in binary/digital form.

Therefore, the absolute value recorded by the measuring system and the fine value determined separately between two values of the recorded absolute value are brought together instantly in the electronics of the encoder, combined as a total absolute value in binary/digital form and provided for encoder output across the whole operating range. Thus, all of the signal processing occurs in the scanning head, so that complicated signal transfer (cable, shielding etc.) is considerably simplified and costly electronic peripherals (AD converters, sample and hold components, processors etc.) may be dispensed with.

The said patent application describes relationships between greatest measurement speed and resolution, which show that encoder resolutions above the 18 bits required for the field of application (e.g. motors with 0 to 6000 rpm or positioning speeds of up to 10 m/sec.) are approaching the limits of the system. In cases requiring resolutions of, for example, 20 bits and greater, it is recommended to transfer the 12-bit SIN/COS signals (analog values) from the encoder to the evaluation unit in addition, in order to carry out external finest resolutions of, for example, 10 bits. A resolution of the angular/path sections approaching 22 bits can be achieved with all of the additional features associated with this such as wiring measures, components, susceptibilities and above all problematic encoder accuracy.

SUMMARY OF THE INVENTION

It is accordingly an object of the invention to provide a measuring system which overcomes the above-mentioned disadvantages of the heretofore-known measuring systems of this general type and which allows an increase in encoder accuracy without the need to accept the above-mentioned disadvantages.

With the foregoing and other objects in view there is provided, in accordance with the invention, a sensor system, wherein a digital absolute value of the particular position of a stationary part (stator) of an encoder (1) with respect to a part moving relative to it (rotor) is created, and which is transferred in serial transmission to an evaluation circuitry (3), whereby the transfer of the absolute value is induced by an external signal, wherein the change in absolute value is recorded each time by the sensor, finest interpolation with selectable absolute resolution takes place beginning each time from the time of said change, and the absolute value is amended by the accumulated result of finest interpolation when interrogated by the external signal.

According to another feature of the invention, the speed derived from the change in the absolute value is taken into consideration during finest interpolation.

According to another feature of the invention, the time of the change is transmitted to the evaluation circuitry (3) via a separate line (5) or old signal output, and finest interpolation occurs in the evaluation circuitry (3).

According to another feature of the invention, transmission of the time takes places via the line (4') for serial transmission of the absolute value.

According to another feature of the invention, finest interpolation takes place in the sensor (FIG. 3).

According to another feature of the invention, the absolute value is amended by the result of finest interpolation before transfer.

According to another feature of the invention, the absolute value and result of finest interpolation are transferred consecutively and the absolute value is amended subsequently.

According to another feature of the invention, the absolute value is created from a scanned absolute track of the rotor and interpolation of the distance/angle in between.

According to another feature of the invention, when using a register (11) to give the absolute value, the change in a certain selectable register position determines the time of the change.

According to another feature of the invention, the edge of the signal changing the register position determines the time.

According to another feature of the invention, a counter (13) counts the pulses of a generator (14) from the time of the change.

According to another feature of the invention, the direction of movement of the rotor of the encoder (1) is determined in the sensor and output via a separate line (L/R).

High position resolution is required, where precise adjustments need to be brought into position as rapidly as possible and the position must be strictly maintained even when there are variations in load or where there is interference. Demanding servo control systems operate at cycle times (time between two control/positioning actions on the drive) of down to approximately 50 $\mu$sec. If we take as an example a shaft of approximately 40$^\varnothing$ mm and an absolute encoder resolution of 17 bits, this corresponds to a resolution increment of approximately 1 $\mu$m.

This means that at most the 1 $\mu$m step is recorded in the cycle time of 50 $\mu$sec., corresponding to an acceleration of $$a = 2s/t^2 = 2 \, \mu m/(50^2 \, *\mu m^2) = (2*10^6)/2500$$

$$a = (2/2.5)*10^3 = 800 \text{ m/sec}^2 \approx 80 \text{ g}$$

However, the aim is to get down to ranges of g=10 m/sec$^2$, which means that resolutions of over 22 bits are required. What is particularly difficult with such resolutions is that with the current state of the art the existing and faded analog signal (SIN/COS signal) with noise for the path must first be differentiated, in order to get the required speed for the controller. The extent of the problem becomes clear when the normal 1V$_{ss}$–SIN/COS signals with a 12-bit AD conversion (e.g. in order to get from a 10-bit incremental base resolution to the 22-bit total resolution) are to be used and need to process voltages of several ¹⁄₁₀mV in harsh industrial conditions.

The underlying invention avoids analog signal processing via cable prone to interference, and costly as well as problematic analog conversions in the evaluation circuitry. Instead only digital signals are used which can be processed precisely and without interference in the computer control systems which function on a digital basis in any case.

This method benefits from, for example, the well known and obvious fact about incremental encoders that division accuracy is much greater than the resolution predetermined by the increment. In addition, the repeatability of the sensor values is many times greater. In practice 30 to 100 times more accurate values are obtained in precision encoders than the resolution, let alone the achievable absolute value accuracy, would predict. This is because the scale disks—for example in optical encoders—are produced using highly accurate lithographic processes. These devices are used in the production of masks for semi-conductors and achieve a precision of up to a few nanometers. This means that synchronized sensor systems—as recited, for example, in Swiss Patent No. 02 105/99—which function on an incremental basis, are predestined to achieve much greater resolutions.

Evaluation systems which record the position of increments on the basis of mean-value generation of several increments, are particularly suitable in this respect. Even the zero crossings of the SIN/COS signals are extremely precisely recorded in the sensor measuring system itself and are thus able to be used further for greater resolutions. A sensor system configured in this way can be used to particular advantage for the embodiment in accordance with the invention for the greatest possible resolution, for example by virtue of its extremely accurate incremental division scaling of, for example, 12 bits, and also bit-wise from 12 to 15 bits (zero-crossings and intercept points of SIN/COS signals can be recorded with particular accuracy).

For the invention, for example, the change in value from a counter reading creating the absolute value at a defined binary digit (for example, 12 bits) is output as a digital signal output (for example, 1=high level, 0=low level) by the angular position or position sensor.

Thus the sensor itself or the external control system—or even both together—can fall back on a correspondingly very precise bit-sequence of, for example, 12 bits and use path interpolation between the signal edges being produced alternately to achieve very highly resolved path measurement as well as velocity determination.

An encoder which uses 12-bit incremental resolution to create absolute values has practicable increments of 20 μm to 30 μm. The signal spacing of two edges produces the exact path of this increment section and can be determined in time at an extremely fine resolution using an oscillator frequency of, for example, 30 to 50 MHz (100 MHz) and a counter.

The velocity is given as v=s/t.

At constant velocity v=constant=K, which gives K*t=s and the section $$\Delta s = K^* \Delta t = K^* (1/f_{oscill})^* \Delta z.$$

$f_{oscill}$=oscillator frequency
z=counter distance from one to the other signal edge (for the given $f_{oscill}$)

$$\Delta z = z_1 - z_2; \ \Delta z_{min} = 1$$

Assuming, for example, a 12-bit signal sequence with a distance of 30 μm and an oscillator of 50 MHz this gives for $t_{cycle}$=50 μsec cycle times at:

1) v=positioning speed of the distance traveled ≦10 m/sec
$f_{12\ bit}$≈300 kHz (transmission frequency of the 12-bit signal output)

$t_{12\ bit}$≈3 μsec $Z_{max}$≈3 μsec/20 nsec=150=7 bit $\Delta s$≈200 nm=0.2 μm $a$≈=2$\Delta s/t^2_{cycle}$=0.4/(2500*10$^6$)=160 m/sec$^2$=16 g Relative total resolution: 12 bit+7 bit=19 bit 2) v=1 m/sec: $f_{12\ bit}$≈30 kHz $t_{12\ bit}$≈30 μsec $Z_{max}$≈30/20=1500≧10 bit $\Delta s$=20 nm=0.02 μm $a$≈2$\Delta s/t^2_{cycle}$=0.04/(2500*10$^6$)=16 m/sec$^2$=1.6 g Relative total resolution: 12 bit+10 bit=22 bit 3) v=0.1 m/sec: $f_{12\ bit}$=3 kHz $t_{12\ bit}$≈300 μsec Since $t_{cycle}$<300 μsec, for maintaining $t_{cycle}$=50 μsec, $f_{15\ bit}$=24 kHz, $t_{15\ bit}$=40 μsec must be selected.

$Z_{max}$≈40 μsec/20*10$^3$ nsec=2000=11 bit $\Delta s$≈4 μm/(2*10$^3$)=2 nm=0.0021 μm $a$≈2$\Delta s/t^2_{cycle}$=(0.004/2500)*10$^6$=4/2.5=1.6 m/sec$^2$=0.16 g Relative total resolution=15 bit+11 bit=26 bit However, this high resolution for recording the relative path and velocity requires reference to the absolute value of the path or angle. Since creation of the absolute value in sensors of, for example, the Swiss Patent No. 02 105/99 takes place under real-time conditions (small 10 nsec spreading width), the method of recording the absolute signal in accordance with the invention allows very precise absolute accuracy to be achieved from the above-listed relative total resolution. Synchronous initiation of finest value formation occurs in the sensor itself simply by means of interpolation between the particular selected and changing values of the absolute value-manipulated variables (for example, from 12 to 17 or 18 bits). External finest value formation (interpolation) occurs through the synchronous initiation of serial interrogation by means of clock-pulse edges of the serial interface SSI with one of the 12-bit signal edges output through the external control system. This, for example, 12-bit value (up to 17; 18 bits) output by the sensor is recorded with an accuracy which fluctuates absolutely in the range of down to 10 nm. For precision encoders with around 40$^\varnothing$-scale disks and 12-bit division scaling, this results in accuracies which are certainly above 22 bits.

Thus, with encoders designed in this way and interrogations, as well as digital interpolation in the sensor or control system, it is also possible to achieve absolute accuracies higher than the nominal absolute value outputs of the encoder (for example through SSI output). As long as the, for example, 12-bit signal sequence (or 13, 14, 15 to 17–18 bits) can be used, markedly greater absolute values or resolutions can be achieved, which are higher than the nominal absolute values of real-time encoders of, for example, 17/18 bits produced to date. This allows very high resolutions over 22 bits to be achieved at practicable process speeds, and which are very simple, cost-effective as well as non-sensitive.

Using internal sensor interpolation it is very simple to determine the appropriate 12 to, for example, 17/18-bit absolute values for interpolation of finest values, by using the velocities of the permanently recorded path/angle distances. In so doing, it is advantageous to choose higher resolutions at correspondingly lower velocities—for example, 17/18 bits for the condition virtually at rest.

For external finest interpolation the signal can be output in a particularly simple and cable/plug-saving design via the data line of a serial interface. During serial data transfer the signal output is blocked and is reactivated immediately after the data transfer process is complete.

At standstill and at a position which is within the, for example, 12 to 15-bit signal sequence (or 17/18-bit) only the resolution and accuracy actually processed by the sensor has any effect and as such determines the capture range of the position to be achieved absolutely under all boundary conditions. The nominal resolution of the sensors must take account of this.

Prior-art control systems at standstill used in practice also make use of the beneficial velocity pick-up when in motion. It can therefore be advantageous to output the, for example, highest resolving bit position as an incremental signal, in order to determine the velocity in the capture range of the absolute position and make it available to the control device. With a 17/18-bit absolute encoder and a shaft of $40^{\varnothing}$ mm, the cycle time and resolution limit are very easy to record within 50 $\mu$sec at approximately 0.5 $\mu$m for the path distance and acceleration through load/interference values of several g.

Using the interpolation described and the resultant changes in velocity of approximately $v \leq 0.02$ m/sec, the positions can be maintained extremely sensitively within the given nominal resolution limits with relative resolutions of up to three orders of magnitude higher, for example, instead of 17/18 bits with 27 to 28 bits. Therefore, with internal interpolation in the sensor, the finest value can be processed with the total absolute value to give a new, more finely resolved absolute value and be transferred via the SSI interface. However, it is also possible and appropriate to amend the total absolute value of 17/18 bits with the particularly determined finest value, and transfer the value separately upon data fetch via SSI.

However, when creating the finest value externally, it is not always sufficient just to combine the total absolute value of 17/18 bits with the signal output of, for example, 12 to 15 bits (17/18 bits) derived from the absolute value for adjustment via the control system.

In cases where adjustments are made at very slow speeds and there is, for example, a limited possibility of rapid transfer of absolute values or retrieval of measured values, it is advantageous to transmit the direction of movement of the sensor (forwards/backwards, or left/right) as a signal, in addition to the incremental signal, and make it available to the control system. It is also advantageous, if the resolution of the incremental signal is programmable from for example 12 to 17/18 bits (for a 17/18-bit absolute encoder) or may be freely adjusted and retrieved by the external control system whenever required. This also takes account of the various positioning movement speeds, which require the high resolution of the incremental signal of up to 17/18 bits only for very slow movements down to the position of rest, and thus do not have a problem in maintaining low transmission frequencies.

Since absolute positions in what are predominantly industrial applications generally fluctuate in approximately the $\mu$-range, cost-effective nominal absolute value encoders should be developed only for this range of resolution and the higher resolutions required for moving processes should be achieved by implementing the requirements as described in the claims. Hence, it is possible to achieve good-value sensors and simple control systems for very demanding control tasks compared to prior-art designs.

Other features which are considered as characteristic for the invention are set forth in the appended claims.

Although the invention is illustrated and described herein as embodied in a sensor system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
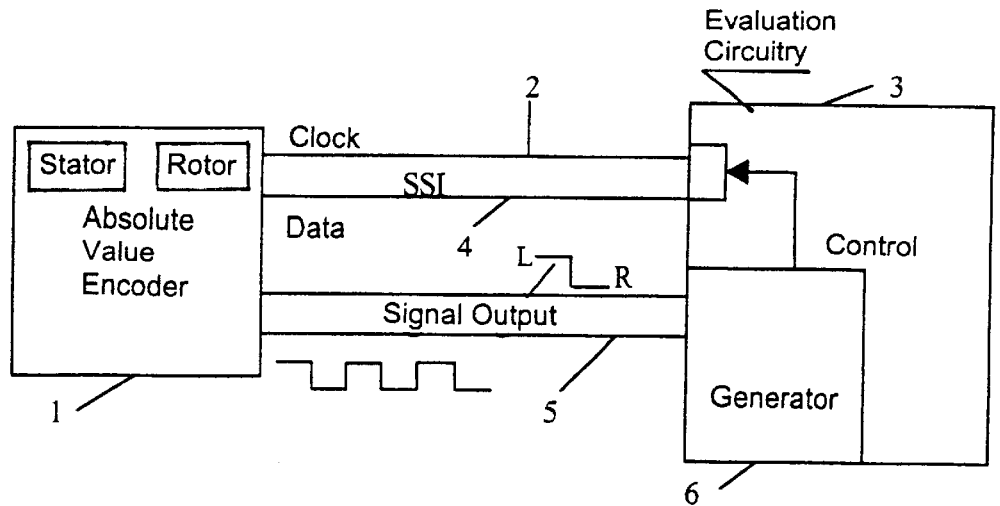
FIG. 1 is a block diagram of a first exemplary embodiment of the invention.

Referring now to the figures of the drawings in detail and first, particularly, to FIG. 1 thereof, there is shown an absolute value encoder 1. The particular position value, or the angle or distance traveled, which has just been established and is present in digital form is transferred serially via a data line 4 by a pulse signal transferred from the evaluation circuitry 3 via a line 2. Transfer can be via the well-known method of the so-called serial interface, SSI.

Parallel to that, a signal (edge) and the directional information left/right are transferred via lines 5 and L/R whenever the digital measured value of encoder 1 changes, which initiates interpolation in the evaluation circuitry 3, for example by routing the pulses of a generator 6, to a counter whose reading gives the relative position of the rotor to the stator between two neighboring digital measured values, and taking into consideration, if relevant, the speed of the rotor in relation to the stator. Using this reading, the digital measurement transferred via line 4 may be amended or refined.

Figure 2:
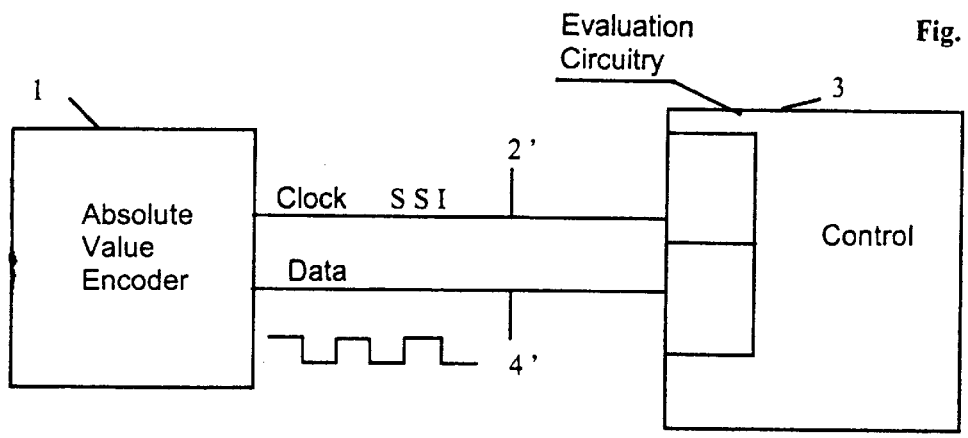
FIG. 2 is a block diagram of a second exemplary embodiment of the invention.

FIG. 2 differs from FIG. 1 in that only one pair of lines 2', 4' is provided between the encoder 1 and the evaluation circuitry 3. As in FIG. 1, interrogation takes place via line 2' and transfer of the interrogated digital value via line 4'. Here, the signal which signalizes a change in the digital value is also transferred via line 4', whereby this transfer is interrupted or blocked whenever there is interrogation via clock line 2' and subsequent serial transfer.

Figure 3:
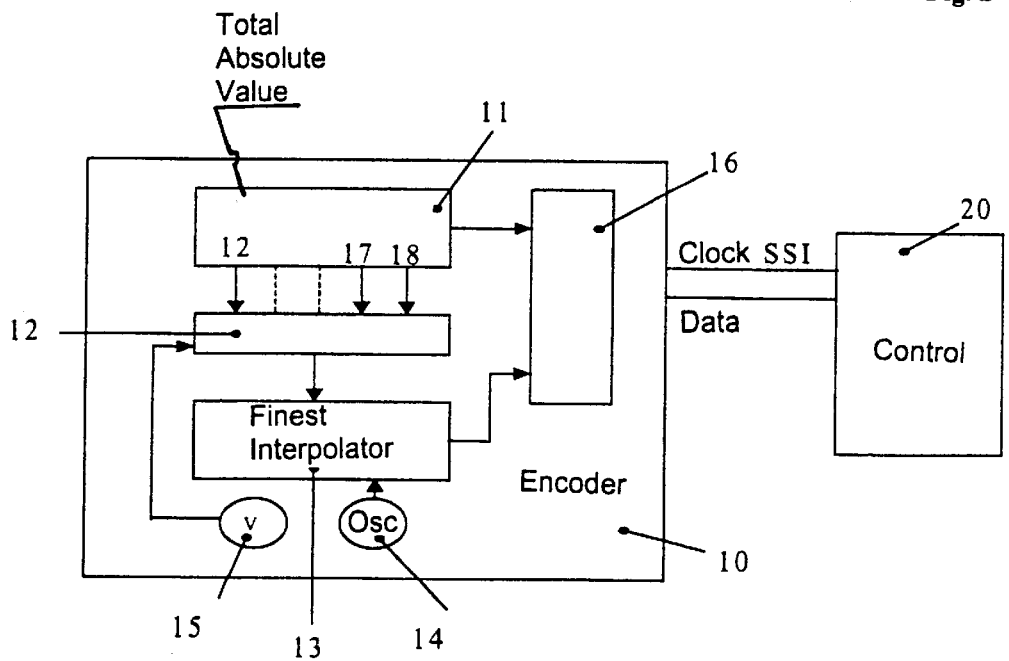
FIG. 3 is a block diagram of a third exemplary embodiment of the invention.

In FIG. 3 interpolation also takes place in the encoder 10. The coarse and fine value determined by the encoder is available in a register 11. If there is a change in the value, for example, in the last place, this is recognized in a block 12 which initiates finest interpolation in a block 13. Block 13 contains, for example, a counter, which, when activated by the signal of block 12, counts the pulses of an oscillator 14.

Advantageously the speed of the measured object is recorded in the sensor, which, as is known, can be determined from the distance traveled per unit time—hence change in the absolute value per time—normalized for the sensor, which will not be described in more detail here.

The speed thus determined in block 15 is used in block 12 to select the manipulated variable from the total absolute value (in 11, coarse and fine value), so that higher resolution values come into effect as speeds decrease. This allows the greatest possible finest resolutions between two measurement times (cycle times) to be achieved and hence also the maximum total resolution of the sensor system.

In the case of retrieving the momentary total absolute value, the results of the register 11 and the block 13 are combined accordingly in a block 16, which then either induces separate transfer of both results to the evaluation circuitry 20, or creates a total absolute value with a higher bit-count and transfers this to the evaluation circuitry 20. The mode of selection can be fix-programmed or be of parameterizable design, so that the desired measured values are retrievable by the control system whenever required.

I claim:

1. A sensor system, comprising:

an encoder including a stationary part and a movable part configured to be movable with respect to said stationary part;

an evaluation circuitry operatively connected to said encoder;

said encoder creating a digital absolute value of a position of said stationary part with respect to said movable part; and said encoder transferring the absolute value in serial transmission to said evaluation circuitry, the serial transmission of the absolute value being induced by an external signal;

one of said encoder and said evaluation circuitry recording a change in the absolute value; and one of said encoder and said evaluation circuitry performing a finest interpolation with selectable absolute resolution beginning each time from a time of the change in the absolute value, and amending the absolute value by an accumulated result of the finest interpolation when interrogated by the external signal.

2. The sensor system according to claim 1, wherein a speed derived from the change in the absolute value is taken into consideration during the finest interpolation.

3. The sensor system according to claim 1, including:

a line connected to said evaluation circuitry, the time of the change in the absolute value being transmitted separate from the absolute value to the evaluation circuitry via said line as a signal output; and said evaluation circuitry performing the finest interpolation.

4. The sensor system according to claim 1, including lines for the serial transmission, said lines for the serial transmission being connected to said evaluation circuitry such that the absolute value and the time of the change in the absolute value are transmitted via said lines.

5. The sensor system according to claim 1, wherein said encoder performs the finest interpolation.

6. The sensor system according to claim 5, wherein said encoder amends the absolute value by a result of the finest interpolation prior to being transferred.

7. The sensor system according to claim 5, wherein said encoder transfers the absolute value and a result of the finest interpolation consecutively and said evaluation circuitry amends the absolute value subsequently.

8. The sensor system according to claim 1, wherein said movable part is a rotor and the absolute value is created from a scanned absolute track of the rotor and an interpolation of a distance/angle in between.

9. The sensor system according to claim 1, wherein one of said encoder and said evaluation circuitry includes a register to give the absolute value, said register is configured such that a change in a certain selectable register position determines the time of the change.

10. The sensor system according to claim 9, wherein said register is configured such that an edge of a signal changing the register position determines the time of the change.

11. The sensor system according to claim 1, wherein:

one of said encoder and said evaluation circuitry includes a generator for generating pulses; and a counter counts the pulses of said generator starting at the time of the change.

12. The sensor system according to claim 1, wherein:

said movable part is a rotor having a direction of movement; and said encoder determines the direction of movement of said rotor and outputs the direction of movement via a separate line.

13. The sensor system according to claim 1, including a serial interface operatively connecting said encoder and evaluation circuitry, said evaluation circuitry initiating, via said serial interface, an external signal for inquiring the absolute value.

14. The sensor system according to claim 1, including a serial interface operatively connecting said encoder and evaluation circuitry, said serial interface providing a clock-pulse edge, said evaluation circuitry synchronously initiating, via the clock-pulse edge, an external signal for inquiring the absolute value when the absolute value changes.

* * * * *